(12) United States Patent
Tsumura

(10) Patent No.: US 6,288,376 B1
(45) Date of Patent: Sep. 11, 2001

(54) METHOD AND APPARATUS FOR MELTING A BUMP BY INDUCTION HEATING

(75) Inventor: Kiyoaki Tsumura, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/362,668

(22) Filed: Jul. 29, 1999

(30) Foreign Application Priority Data

Mar. 10, 1999 (JP) .................................. 11-063179

(51) Int. Cl.[7] .................. H05B 6/10; H05B 6/40
(52) U.S. Cl. ............... 219/635; 219/603; 219/616; 219/651; 219/673; 219/677
(58) Field of Search .................. 219/603, 616, 219/635, 636, 633, 651, 667, 672, 673, 674, 677, 632

(56) References Cited

U.S. PATENT DOCUMENTS

| | | | |
|---|---|---|---|
| 2,803,731 | * 8/1957 | Coburn ........................ | 219/616 |
| 3,031,554 | * 4/1962 | Jackson ........................ | 219/651 |
| 3,460,816 | * 8/1969 | Miller ........................ | 219/651 |
| 4,327,265 | * 4/1982 | Edinger et al. ........................ | 219/616 |
| 4,431,891 | * 2/1984 | Forstner et al. ........................ | 219/616 |
| 4,983,804 | * 1/1991 | Chan et al. ........................ | 219/616 |
| 4,989,070 | * 1/1991 | Iversen et al. ........................ | 357/82 |
| 5,554,836 | * 9/1996 | Stanescu et al. ........................ | 219/651 |
| 5,969,262 | * 10/1999 | Ino et al. ........................ | 73/827 |

FOREIGN PATENT DOCUMENTS 3-141654 * 6/1991 (JP) .

* cited by examiner

Primary Examiner—Philip H. Leung
(74) Attorney, Agent, or Firm—McDermott, Will & Emery

(57) ABSTRACT

According to a method of melting a bump improved to omit processes of flux application, reflow, cleaning and drying, a bump formed on a substrate is heated and melted by electromagnetic induction using an induction heating coil in ambient of low oxygen concentration.

11 Claims, 16 Drawing Sheets

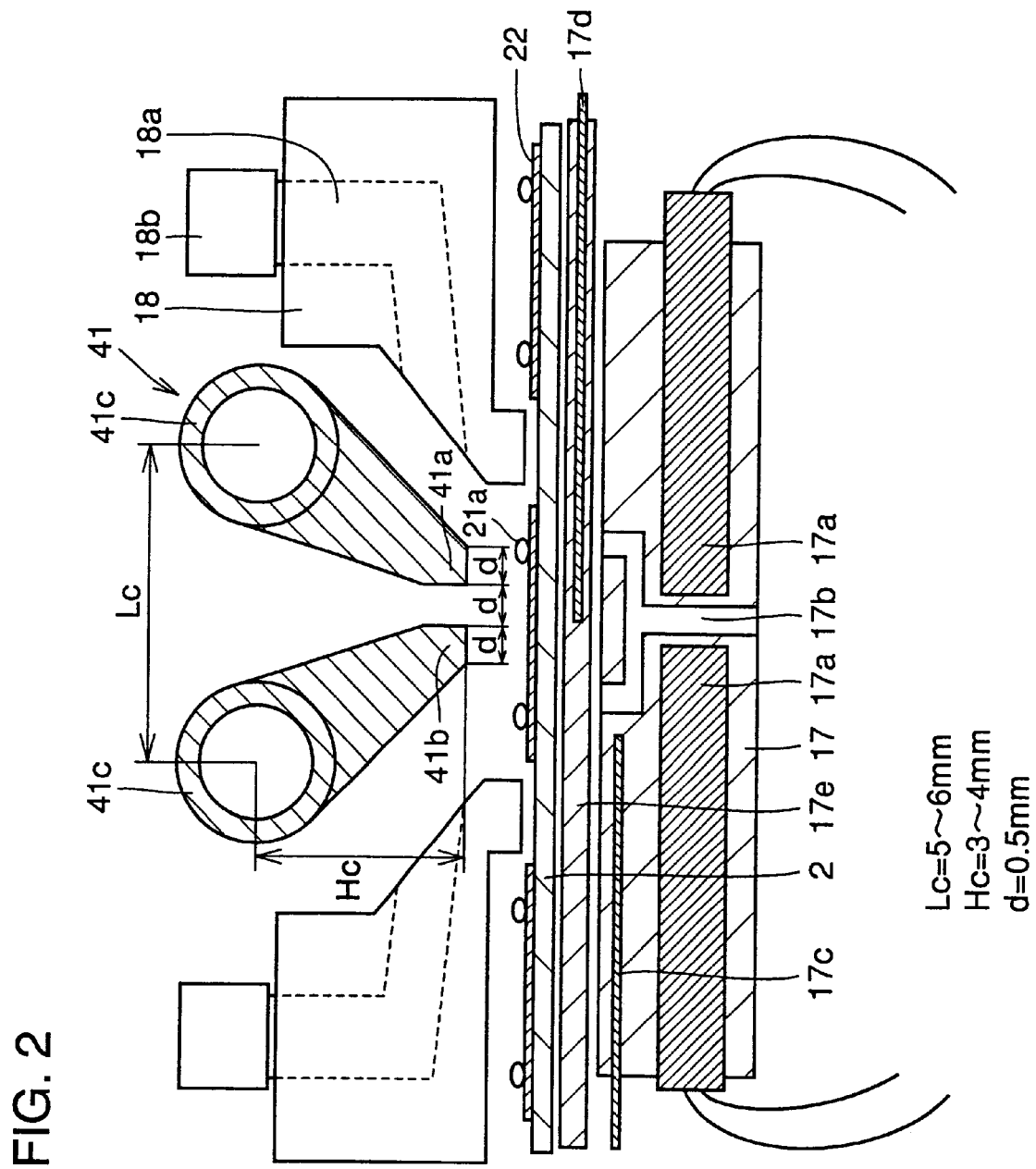

◎  FROM BACK TO FRONT WITH THE PLANE OF THIS DRAWING AS A BASIS
X  FROM FRONT TO BACK WITH THE PLANE OF THIS DRAWING AS A BASIS

METHOD AND APPARATUS FOR MELTING A BUMP BY INDUCTION HEATING

BACKGROUND OF THE INVENTION

1. Field of the Invention

The present invention generally relates to a method of melting a bump. In particular, the invention relates to a method of melting a bump that is improved to melt, in the dry process, a bump formed on a metal interconnection provided on a substrate or a bump formed an electrode of a semiconductor device such that the bump is sphered. The invention further relates to an apparatus for melting a bump improved to realize such a method of melting a bump. The invention still further relates to a method of manufacturing a semiconductor device including such a method of melting a bump.

2. Description of the Background Art

FIG. 12 is a plan view of a substrate on which solder bumps are produced. FIG. 13 is a partial cross sectional view along the line XIII—XIII in FIG. 12.

Referring to these figures, a substrate 2 is formed of resin such as glass epoxy or polyimide. A patterned copper foil 21 is mounted on one surface of substrate 2. A solder resist 22 is applied onto substrate 2 to cover copper foil 21. Laser drilling of the other surface of substrate 2 and laser drilling of solder resist 22 produce respectively an outer electrode portion 21b and an inner electrode portion 21a. Inner electrode portion 21a and outer electrode portion 21b are formed of plating of Ni/Au, Ni/Pd/Au or the like. Ball bonding of a solder wire to inner electrode portion 21a produces a solder bump 21c. Substrate 2 onto which flux is applied is passed through a reflow furnace to make solder bump 21c into a sphere. Substrate 2 and an electrode of a semiconductor chip are bonded together with solder bump 21c therebetween. The resultant product is entirely sealed with resin and an outer ball of solder is attached to outer electrode 21b. The product is then cut into separate packages as final products.

The conventional art discussed above is hereinafter described in detail with reference to figures.

FIG. 14 is a plan view illustrating a conventional art of applying flux for generating solder balls on a substrate. FIG. 15 is a plan view of a reflow furnace for melting solder. FIG. 16 is a cross sectional view along the line XVI—XVI in FIG. 15. FIG. 17 shows a temperature profile in the reflow furnace.

Referring to these figures, substrate 2 enters a melting reflow furnace 3 from a reflow furnace in-loader 31, and moves from the first zone to the fourth zone by use of a reflow carrier belt 33. Substrate 2 is heated by an upper heater 32a and a lower heater 32b. Solder bump 21c is melted to be sphered under the profile temperature conditions shown in FIG. 17, namely at 140–160° C. for 70±20 seconds in the second zone and at 200–220° C. for 90 seconds or less in the fourth zone, and under a condition of an oxygen concentration of 1000 ppm or less. Substrate 2 is thereafter taken out from an unloader 34.

In order to remove the flux, a cleaning process with solvent and a drying process are carried out. A similar method is employed for a process of bonding solder to an outer electrode and a process of forming solder on elements on a printed circuit board.

The conventional art discussed above has the following problems.

The first problem is that four processes of applying the flux, reflowing, cleaning, and drying are required after generating the bump of the inner electrode portion, leading to reduction in productivity, and the residue of the flux deteriorates the reliability of the product.

The second problem is that contaminants in the cleaning fluid attach to the surface of the outer electrode on the bottom surface of the substrate in the cleaning process, and thus disturb sticking of solder paste used for bonding the outer ball after sealing process, resulting in peeling off of the ball.

The third problem is that the temperatures of bump 21c and substrate 2 rise to almost the same value within the reflow furnace so that the substrate is melted before the bump is melted if the reflow temperature is set at the glass transition point Tg or more. Therefore, medium temperature solder such as Sn—Ag and Sn—Sb and refractory metals such as Au and Cu cannot be used. Then, those products that satisfy both of the requirements of product quality and cost cannot be manufactured.

SUMMARY OF THE INVENTION

One object of the present invention is to provide a method of melting a bump improved to omit processes of flux application, reflow, cleaning and drying for any bonding material formed on a substrate or a chip.

Another object of the invention is to provide a method of melting a bump improved to enhance the quality of bonding.

Still another object of the invention is to provide a method of melting a bump improved to freely set the range of control temperature and to increase the range of the melting point which can be treated.

A further object of the invention is to provide an apparatus for melting a bump improved to realize such methods of melting a bump.

A further object of the invention is to provide a method of manufacturing a semiconductor device improved to reduce the time for bonding a substrate with a chip and thus enhance the productivity.

According to a method of melting a bump in the first aspect of the invention, a bump formed on a substrate is heated to be melted by electromagnetic induction using an induction heating coil in an ambient of low oxygen concentration.

According to a method of melting a bump in the first aspect of the invention, the heat is generated by current induced in the bump itself not by heat transfer or radiant heat originating from a heat source outside the bump, and the bump is sphered without an oxide film generated on its surface.

According to a method of melting a bump in the second aspect of the invention, the temperature of the substrate is measured and the amount of current applied to the induction heating coil is controlled according to the measured temperature.

According to the method of melting a bump in the second aspect of the invention, the amount of current applied to the induction heating coil can appropriately be controlled.

According to a method of melting a bump in the third aspect of the invention, the magnetic field of the induction heating coil is applied perpendicularly to the surface of the substrate, the induction heating coil is moved horizontally relative to the surface of the substrate, and the substrate is heated by a heater in order to reduce the current applied to the induction heating coil.

The method of melting a bump in the third aspect of the invention achieves a high productivity.

According to a method of melting a bump in the fourth aspect of the invention, the bump is melted while the substrate is cooled using a Peltier device.

The method of melting a bump in the fourth aspect of the invention allows a bump of refractory metal to be melted into a sphere shape without damage to the substrate.

An apparatus for melting a bump in the fifth aspect of the invention relates to an apparatus for melting a bump formed on a substrate. The apparatus includes ambient supply means for supplying an ambient of low oxygen concentration onto the substrate, and an induction heating coil for heating the bump by electromagnetic induction.

The apparatus for melting a bump in the fifth aspect of the invention can sphere the bump without oxide film generated on its surface.

In an apparatus for melting a bump in the sixth aspect of the invention, the induction heating coil is U-shaped in plan view.

The apparatus for melting a bump in the sixth aspect of the invention provides a manufacturing method with a high productivity.

In an apparatus for melting a bump in the seventh aspect of the invention, the induction heating coil includes a cylindrical section through which cooling water flows, and a high-frequency current applying section extending downward from the cylindrical section with high frequency current flowing therethrough.

The apparatus for melting a bump in the seventh aspect of the invention prevents the induction heating coil itself from being melted.

In an apparatus for melting a bump in the eighth aspect of the invention, the high-frequency current applying section obliquely extends downward.

In the apparatus for melting a bump in the eighth aspect of the invention, the bump can be heated efficiently.

In an apparatus for melting a bump in the ninth aspect of the invention, a cross sectional shape in a plane perpendicular to the direction in which the induction heating coil extends is substantially a right-angled isosceles triangle.

In the apparatus for melting a bump in the ninth aspect of the invention, eddy current can be generated in the bump.

In an apparatus for melting a bump according to the tenth aspect of the invention, the cylindrical section and the high-frequency current applying section are integrally formed of copper.

In the apparatus for melting a bump according to the tenth aspect of the invention, the induction heating coil can be processed with high precision.

In an apparatus for melting a bump according to the eleventh aspect of the invention, one of two sides except for the hypotenuse of the right-angled isosceles triangle is placed in parallel with the substrate.

In the apparatus for melting a bump according to the eleventh aspect of the invention, eddy current can be produced in the bump.

In an apparatus for melting a bump according to the twelfth aspect of the invention, the cross sectional shape of the induction heating coil is substantially symmetrical relative to a straight line extending from the center of the cylindrical section to the apex of the right-angled isosceles triangle.

According to the apparatus for melting a bump in the twelfth aspect of the invention, the induction heating coil is simply fabricated.

An apparatus for melting a bump according to the thirteenth aspect of the invention includes temperature measuring means for measuring the temperature of the substrate, and apply current control means for controlling the amount of current applied to the induction heating coil according to information from the temperature measuring means.

According to the apparatus for melting a bump in the thirteenth aspect of the invention, the current applied to the induction heating coil can properly be adjusted.

An apparatus for melting a bump in the fourteenth aspect of the invention includes disposing means for disposing the induction heating coil to allow the magnetic field of the induction heating coil to be applied perpendicularly to the surface of the substrate, moving means for moving the induction heating coil horizontally relative to the surface of the substrate, and heating means for heating the substrate.

The apparatus for melting a bump according to the fourteenth aspect of the invention implements a manufacturing method with a high productivity.

An apparatus for melting a bump according to the fifteenth aspect of the invention further includes a Peltier device for cooling the substrate.

The apparatus for melting a bump according to the fifteenth aspect of the invention can sphere the bump of refractory metal without damage to the substrate.

According to a method of manufacturing a semiconductor device in the sixteenth aspect of the invention, a substrate where a first metal for bonding is formed and a semiconductor device where a second metal for bonding is formed are made into contact with each other and pressurized for preliminary bonding. Next, the first metal for bonding and/or the second metal for bonding are/is heated by electromagnetic induction using an induction heating coil for main bonding of the substrate with the semiconductor device.

According to the method of manufacturing a semiconductor device in the sixteenth aspect of the invention, bonding with high reliability is implemented without damage to the substrate.

According to a method of manufacturing a semiconductor device in the seventeenth aspect of the invention, the temperature of the substrate is measured and the amount of current applied to the induction heating coil is controlled according to the information on the temperature.

According to the method of manufacturing a semiconductor device in the seventeenth aspect of the invention, bonding with a high reliability is implemented without damage to the substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a cross sectional view along the line II—II in FIG. 1.

DESCRIPTION OF THE PREFERRED EMBODIMENTS

Embodiments of the invention are hereinafter described in conjunction with the drawings.

First Embodiment

Figure 1:
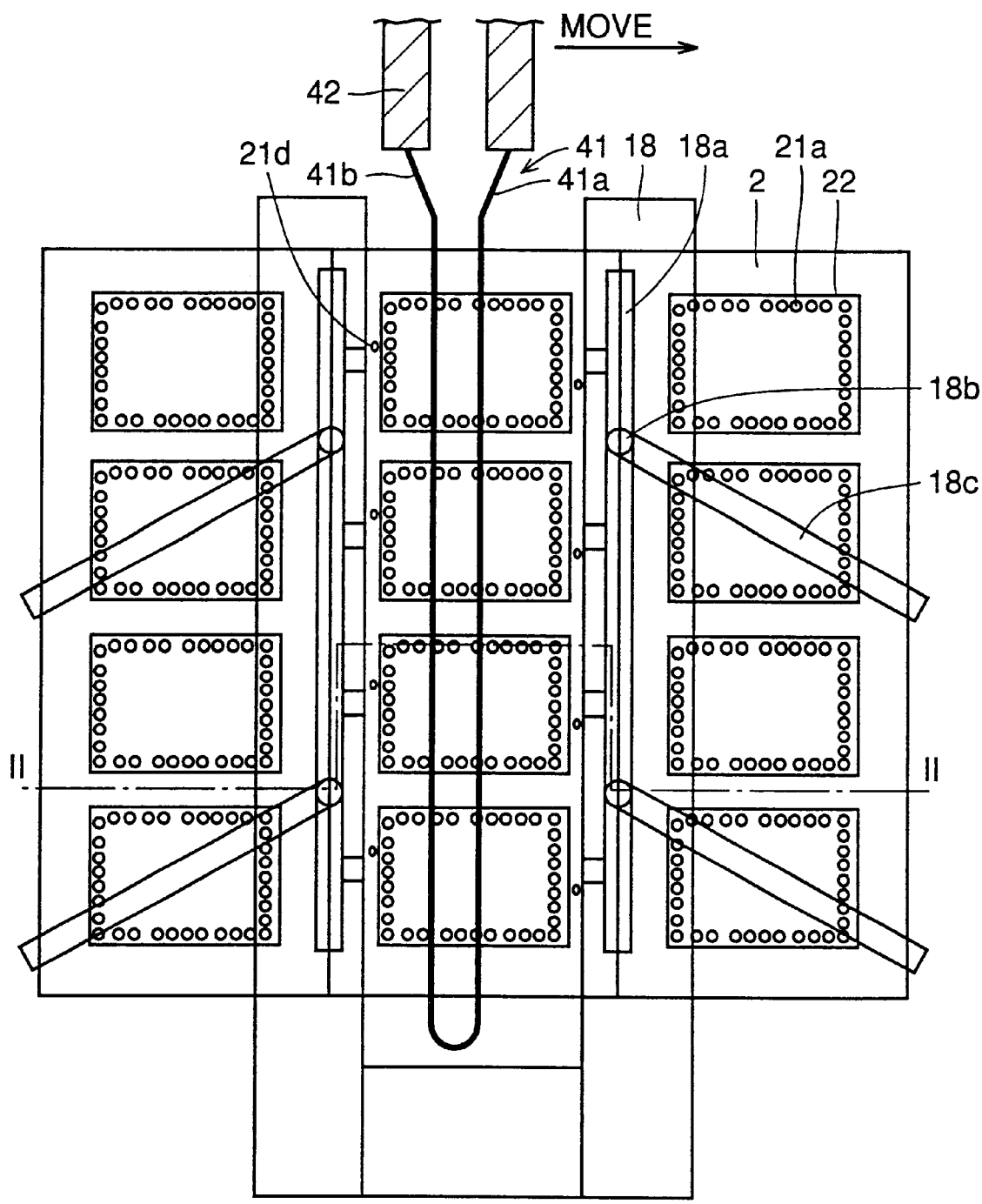
FIG. 1 is a plan view illustrating a method of melting a bump according to the first embodiment.

FIG. 1 is a plan view illustrating a method of melting a bump in the first embodiment. FIG. 2 is a cross sectional view along the line II—II in FIG. 1. In FIG. 2, Lc, Hc and d respectively represent dimensions. Referring to these figures, a substrate 2 is placed between a substrate holder 18 and a heat block 17 and fixed there. In substrate holder 18, a gas supply hole 18a is formed. A supply pipe 18c is connected at a joint 18b to the outside of substrate holder 18. A mixed gas of nonoxidizing nitrogen and hydrogen is supplied from supply pipe 18c to supply the mixed gas of nitrogen and hydrogen from an outlet of gas supply hole 18a to substrate 2.

An induction heating coil 41 is U-shaped in the plan view. Induction heating coil 41 includes a cylindrical section 41c through which cooling water flows, and high-frequency current applying sections 41a and 41b extending downward from the cylindrical section through which high frequency current flows. High-frequency current applying sections 41a and 41b obliquely extend downward. The cross sectional shapes of the tips of high-frequency current applying sections 41a and 41b in a plane perpendicular to the direction in which induction heating coil 41 extends are substantially right-angled isosceles triangles.

Induction heating coil 41 is disposed such that one of the two sides except for the hypotenuse of the right-angled isosceles triangle is in parallel with substrate 2. The cross sectional shape of induction heating coil 41 is substantially symmetrical relative to the straight line extending from the center of cylindrical section 41c to the apex of the light-angled isosceles triangle. Cylindrical section 41c and high-frequency current applying sections 41a and 41b are integrally formed of copper in order to be processed with high precision. A cavity with a diameter of 2 mmφ is formed in cylindrical section 41c through which cooling water flows. Cylindrical section 41c is connected to a copper pipe for water cooling 42 through which the cooling water flows. The cooling water flows within cylindrical section 41c and high frequency current is applied to the copper tube itself.

Under substrate holder 18, heat block 17 having a built-in heater 17a is placed. Heat block 17 is structured to suck substrate 2 by drawing air from a vacuum suction hole 17b. The suction of substrate 2 allows the warp of substrate 2 to be made flat if the substrate has a thickness of 100 μm.

Figure 3A:
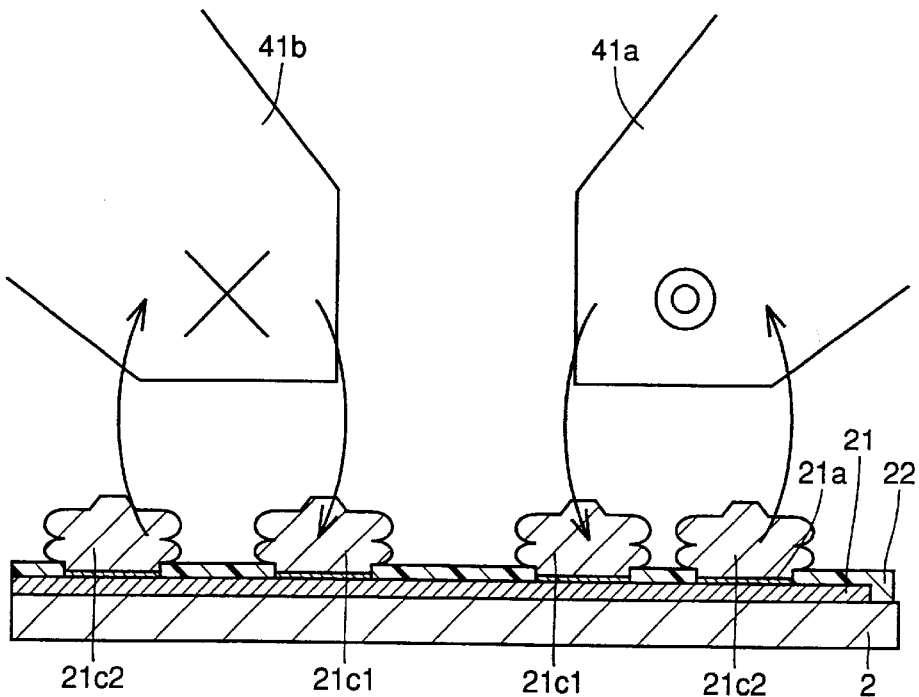
FIGS. 3A and 3B illustrate a process of applying current to an induction heating coil for heating solder.
Figure 3B:
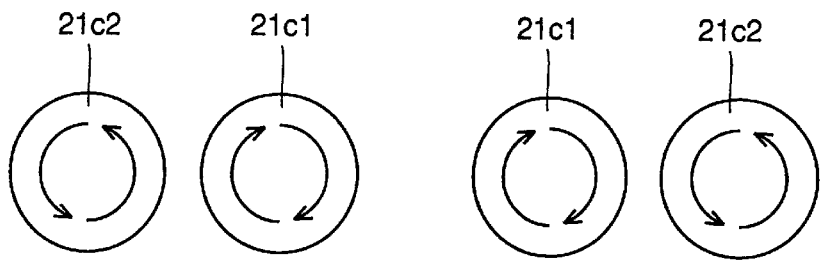

FIGS. 3A and 3B show a process of applying current to the induction heating coil to heat solder. FIG. 3A is a cross sectional view along the line II—II in FIG. 1 and FIG. 3B is a plan view thereof. Referring to these figures, a solder 21c1 and a solder 21c2 are produced by bonding fine wires of solder having Pb—Sn composition with gold plating (21a) on a copper foil 21. Each solder has a shape of a ball deformed by pressure.

Regarding the direction in which alternating current is applied, in FIG. 3A, the current flows from the back to the front in a right coil (41a) and from the front to the back in a left coil (41b) with the plane of the drawing as a basis. As a result, downward magnetic flux is generated in solder 21c1 on substrate 2 and upward magnetic flux is generated in solder 21c2.

As shown in FIG. 3B, magnetic flux which cancels the above magnetic flux is generated according to the principle of electromagnetic induction so that clockwise induction current and counterclockwise induction current are produced respectively in solder 21c1 and solder 21c2. Such current is referred to as eddy current. In solder 21c1, the current flows from the back to the front with the plane of the drawing as a basis, and the current flows from the front to the back in solder 21c2 with the plane of the drawing as a basis.

High frequency current flows through induction heating coil 41 and accordingly alternating current flows through solder 21c1 and solder 21c2. Resistance loss (eddy current loss) due to the eddy current causes the inside of the solder to generate heat. Current is applied to induction heating coil 41 until the temperature of the solder rises to the melting point or more and a nonoxidizing ambient is provided therearound. As a result, the surface tension causes solder 21c1 and solder 21c2 to be sphered without an oxide film on their surfaces even if the flux is not used.

Figure 4:
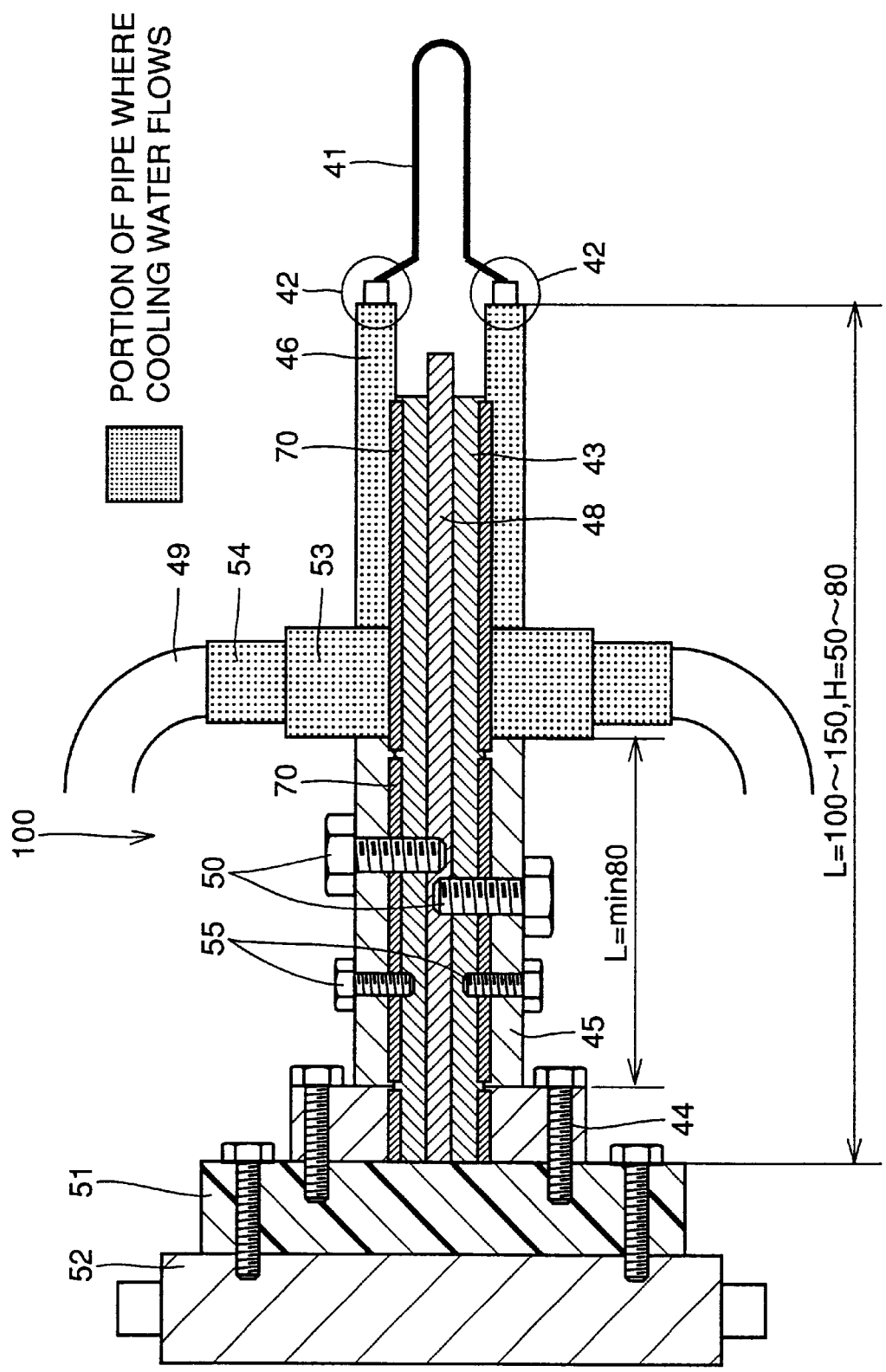
FIG. 4 is a cross sectional view of an induction heating head.

FIG. 4 is a cross sectional view of an induction heating head. The induction heating head is used for transmitting induction heating energy to induction heating coil 41. The induction heating head is substantially symmetrical relative to the central line. The induction heating head includes a base copper plate 43. A brass fixing plate 44, a matching unit feeder receiving copper plate 45, and a water cooling copper pipe 46 are attached to base copper plate 43 by silver brazing. Matching unit feeder receiving copper plate 45 is screwed to a Teflon insulating plate 48 of 1–2 mmt with an M8 plastic screw 50. A water cooling pipe 49 is connected to water cooling copper pipe 46 via a new push 54 of 8φ and a socket 53 of PT1/8. Socket 53 and water cooling copper pipe 46 is attached to base copper plate 43 by silver brazing 70.

The cooling water supplied from water cooling pipe 49 flows through new push 54, socket 53 and water cooling copper pipe 46 to induction heating coil 41. The temperature of induction heating coil 41 is thus prevented from rising. A glass epoxy insulating plate 51 is fixed to a head rotation axis 52 to allow a front section 100 located in front of brass fixing plate 44 to swing.

Figure 5:
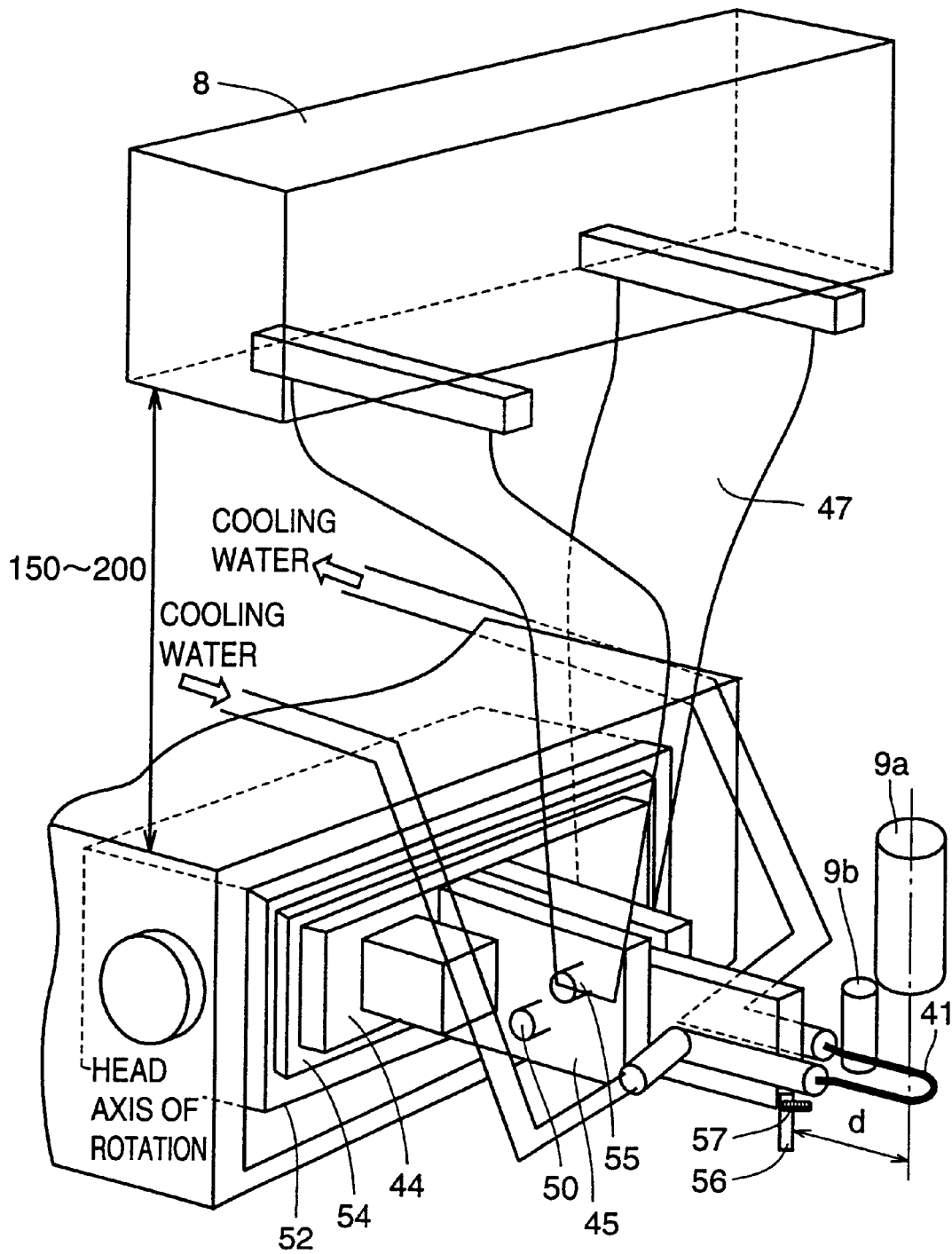
FIG. 5 is a perspective view of the induction heating head.

FIG. 5 is a perspective view of the induction heating head. A matching unit 8 is used for applying an optimum current to induction heating coil 41 by matching high frequency current generated at a high-frequency induction heating power source body with the impedance of induction heating coil 41. An electrode feeder 47 is electrically connected to heating coil 41 by matching unit feeder receiving copper plate 45 and an M6 volt 55.

Head rotation axis 52 has a linear coil and a magnet (not shown) at its rear part. Application of current to the linear coil produces repelling and attraction relative to the magnet to form a linear motor. A detection camera 9a attached to the tip of induction heating head detects a position offset d between induction heating coil 41 and substrate (not shown). A coining marker 56 attached to base copper plate 43 by using a volt 57 detects the heights of induction heating coil 41 and the substrate.

A non-contact thermometer 9b monitors with infrared ray (IR) the temperature of the substrate which is being heated and the data is used for changing the value of heating current and the time.

Figure 6:
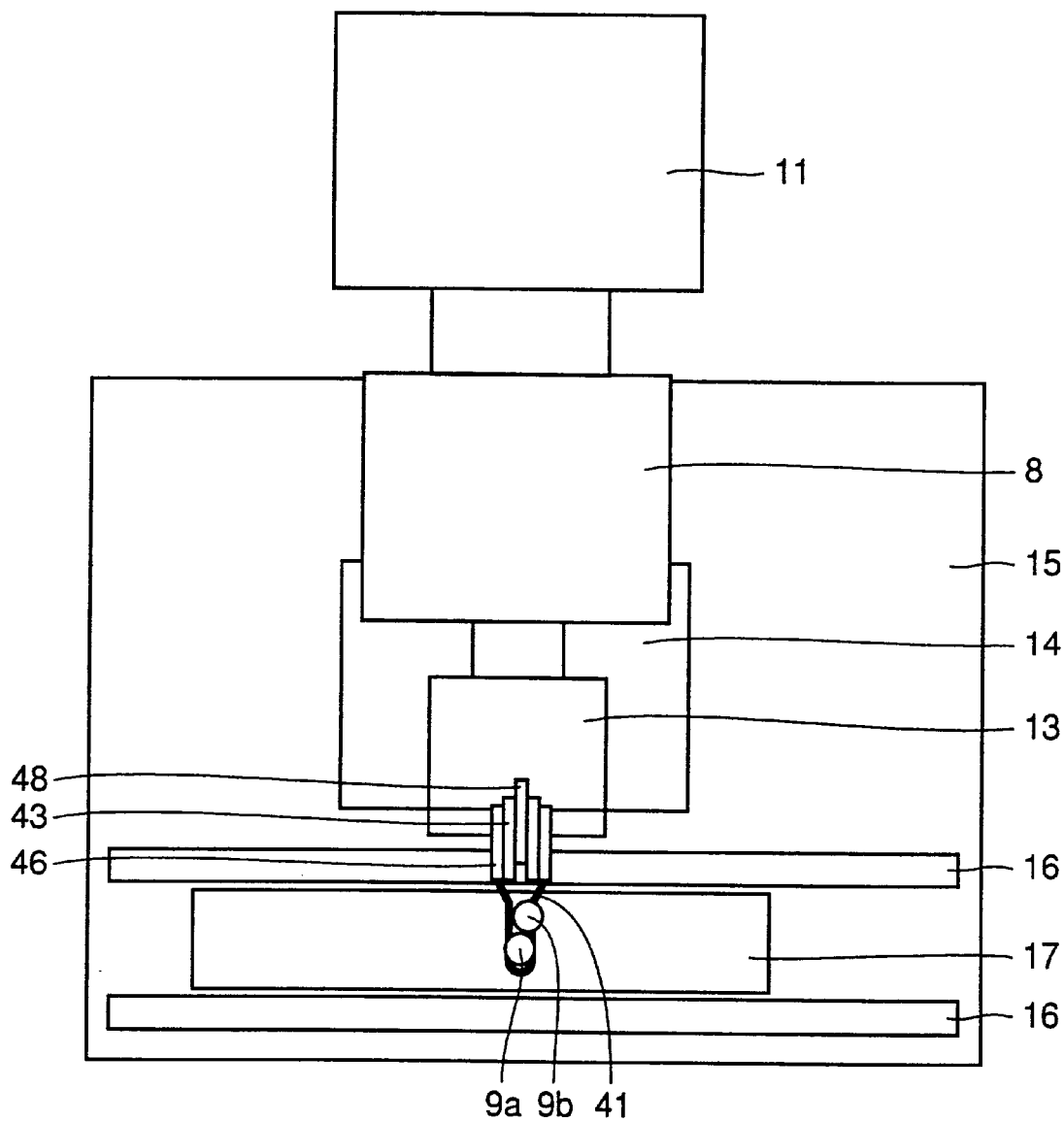
FIG. 6 is a plan view of an entire apparatus for melting a bump.
Figure 7:
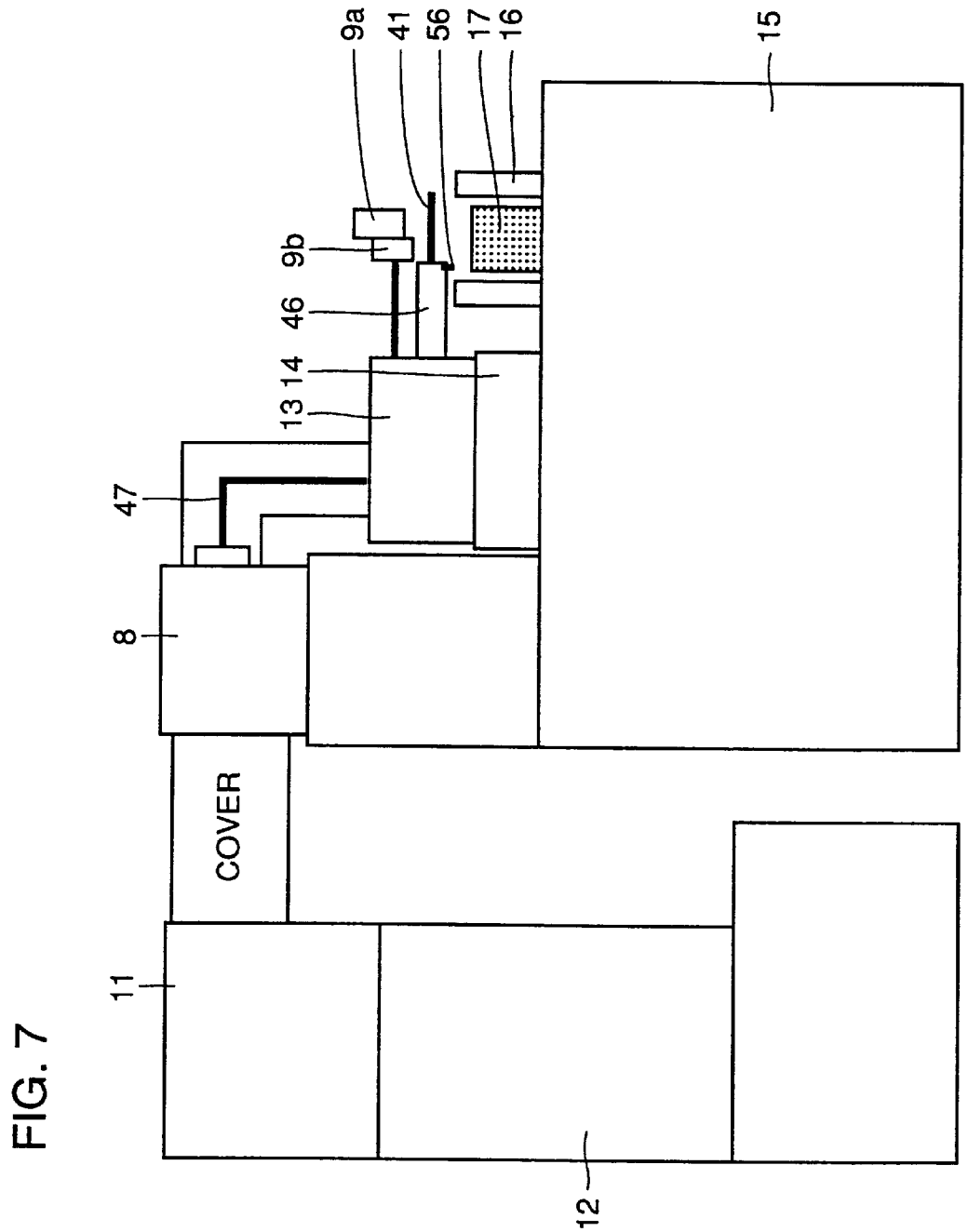
FIG. 7 is a side view of the entire apparatus for melting a bump.

FIG. 6 is a plan view illustrating an entire apparatus for melting a bump, and FIG. 7 is a side view thereof. Referring to these figures, the apparatus for melting a bump is structured of a high-frequency induction heating power supply body 11, a transformer 12, a matching unit 8, and a heating coil head 13.

Heating coil head 13 is mounted on an XY table 14 on a substrate transfer unit 15 and controlled there. A substrate feeder 16 and heat block 17 together transfer the substrate, position the substrate, and heats and melts solder. The power supply in use is 50/60 HZ and 200/220V having 4.5KVA ability. Cooling water is supplied from an outer chiller unit with water pressure of 2.5–3 Kg, water amount of 10–12 L/min, and water temperature of 22–30° C.

An operation is next discussed. Referring to FIGS. 6, 7 and 2, substrate 2 is transported from the left in the drawing of substrate feeder 16, passed pitch by pitch by a clamp claw (not shown) and thus positioned at heat block 17. Substrate 2 is heated to the temperature of 130–150° C.

Detection camera 9a detects the position of a solder bump formed on an electrode of each solder resist or a positioning electrode (without solder bump) processed simultaneously with an electrode. Induction heating coil 41 is shifted to the left end of the line of bumps. The linear motor causes induction heating coil 41 to fall to the position of the bottom surface detected by a bottom surface detection coining marker. Induction heating coil 41 is moved from the left to the right while high frequency current is applied to induction heating coil 41 for a prescribed time period.

At the same time, a mixed gas of nitrogen and hydrogen is sprayed toward the inside of substrate holder 18 from gas supply pipe 18c (see FIG. 1) to generate a nonoxidizing ambient on substrate 2. The effect of induction heating causes the temperature of the solder on the electrode to rise in this state and the solder is then melted. The surface tension of the solder provides a good sphericity and thus a solder bump having a less surface oxide film is produced.

At this time, cooling water is supplied from cooling water copper pipe 42 to induction heating coil 41 in order to prevent the temperature of the induction heating coil itself from rising and prevent the induction heating coil from melting. After the temperature of the solder rises and the solder is accordingly melted, the temperature of the induction heating coil 41 rises again and the substrate is transported by clamp. A following substrate is then positioned.

According to the present invention, even if the arrangement of solder bumps on the substrate is different depending on the type of the product, the conventional processes of flux application, reflow, cleaning and drying can be omitted regardless of the arrangement of portions to be heated, by just forming the induction heating coil into a hair pin shape and heating the induction heating coil while moving the coil. As a result, a manufacturing method with a high productivity is achieved. Further, substrate 2 is heated by heat block 17, so that heating energy and time required for increasing the temperature of the solder can be made minimum.

Second Embodiment

This embodiment is applied to a case in which refractory metal (Au, Cu or the like) is bonded to an electrode on a substrate. The melting point of Au is 1064° C. and that of Cu is 1085° C. When such refractory metal is used, a copper foil interconnection and the substrate are simultaneously heated, possibly leading to damage to the substrate. In order to solve this problem, only the metal on the electrode should be heated to the melting point or more, and other components should be maintained at a temperature equal to or less than the glass transition temperature Tg of the substrate (200–280° C.).

Specifically, referring to FIG. 2, a thermocouple 17d is placed in a platen 17e and a thermocouple 17c is placed in a Peltier device for cooling 17. When the metal on the electrode is heated by high frequency heating, the temperature for heating the copper foil interconnection and the substrate is controlled to be equal to the glass transition temperature Tg of the substrate or less. Such a scheme allows a bump of refractory metal to be melted into a sphere shape without damage to the substrate.

Third Embodiment

This embodiment is applied to an example of bonding solder or refractory metal onto an electrode of a semiconductor device and thereafter melting the solder or the refractory metal to sphere it.

Figure 8:
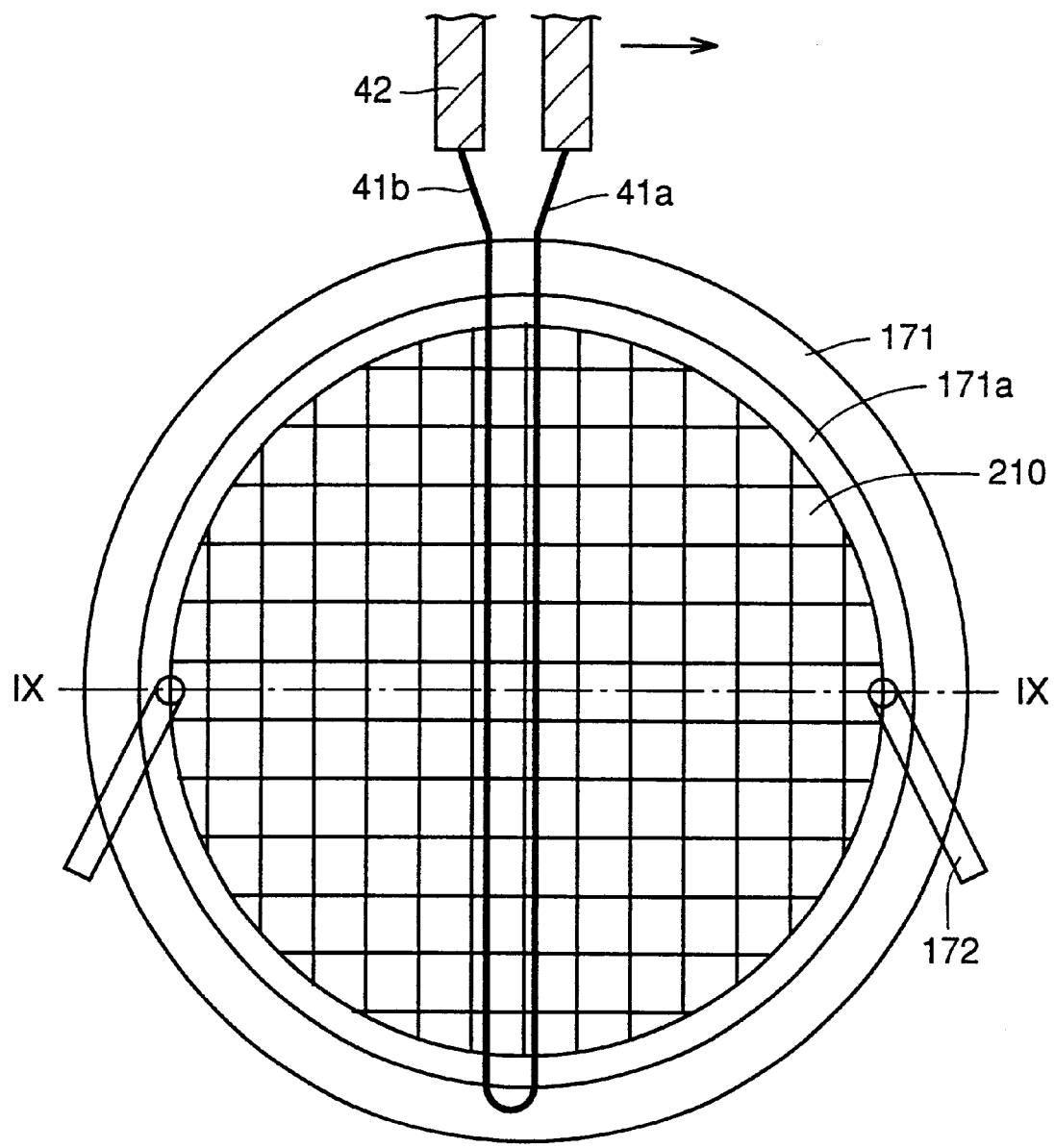
FIG. 8 is a plan view of a bump heating device.
Figure 9:
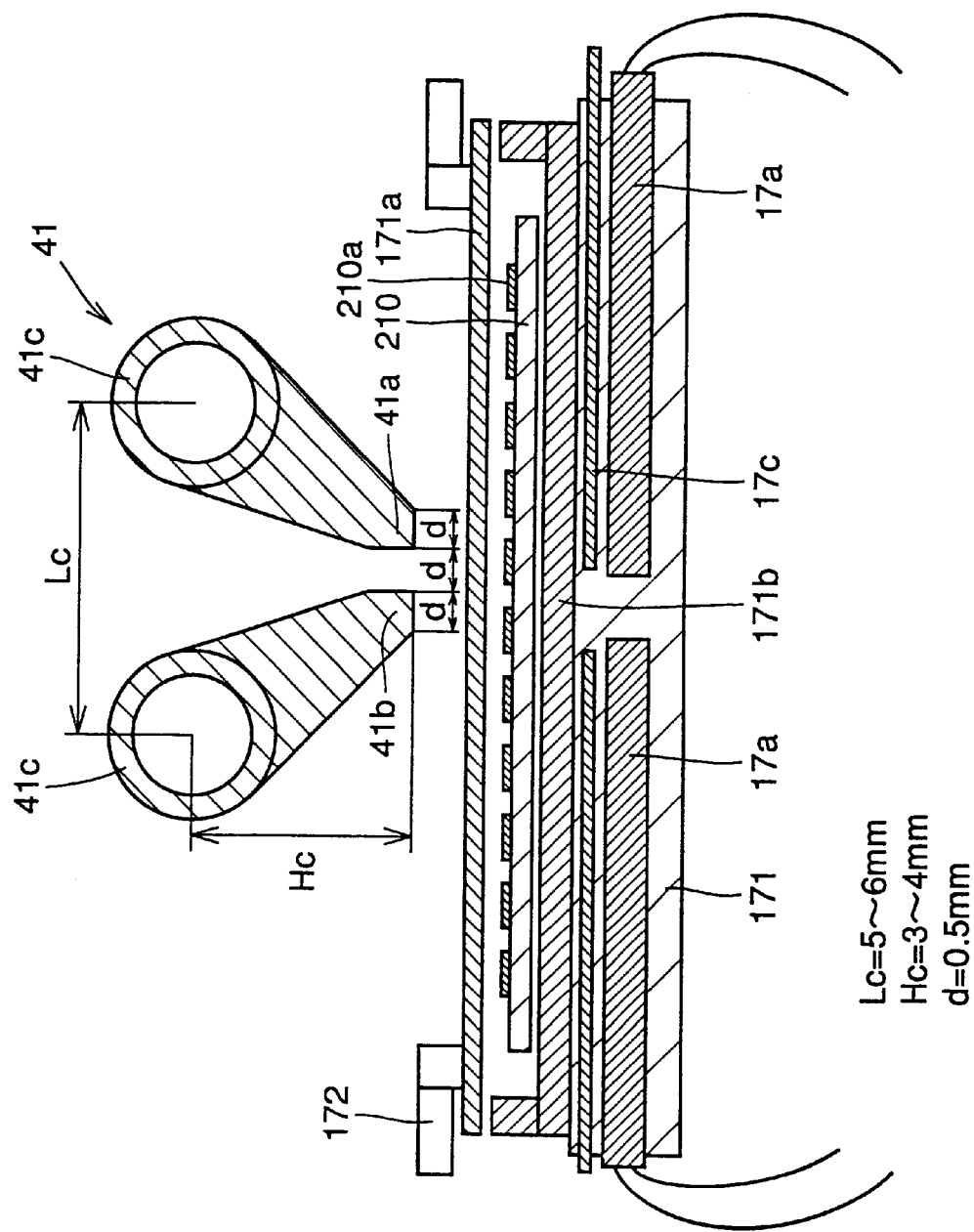
FIG. 9 is a cross sectional view along the line IX—IX in FIG. 8.

FIG. 8 is a plan view of a bump heating device. FIG. 9 is a cross sectional view along the line IX—IX in FIG. 8.

Referring to these figures, a wafer chamber 171b is placed on a heat block or a cooling block 171. Wafer chamber 171b is closed with a wafer chamber lid 171a. Within wafer chamber 171b, a wafer 210 with bumps is located. An ambient gas supply pipe 172 is connected to wafer chamber lid 171a. Both are formed of non-conductive material such as resin. A group of bumps 210a are generated on wafer 210.

If solder is used, bump 210a is formed of bulk solder and granulated paste solder, and if refractory metal is used, bump 210a is formed of bulk Au and Au granular paste or bulk Cu and Cu granular paste. An induction heating coil 41 is horizontally moved on wafer chamber lid 171a while wafer 210 is heated from below wafer chamber 171b. Consequently, solder 210a on an electrode of wafer 210 is melted to be formed into a sphere.

An induction heating coil 41c is moved on wafer chamber lid 171a while wafer 210 is cooled from below wafer chamber 171b. Accordingly, refractory metal 210a on the electrode of wafer 210 is melted to be sphered. The distance between wafer 210 and tip portions 41a and 41b of the induction heating coil is made as short as possible to efficiently melt the group of bumps 210a.

According to this embodiment, bumps formed on electrodes of the semiconductor device can be melted into spheres with the wafer as it is.

Fourth Embodiment

This embodiment relates to a method of flip chip bonding of a semiconductor device to a substrate and an apparatus used therefor. As the substrate, the one produced according to the second embodiment and the wafer with bumps produced according to the third embodiment are employed.

Figure 10:
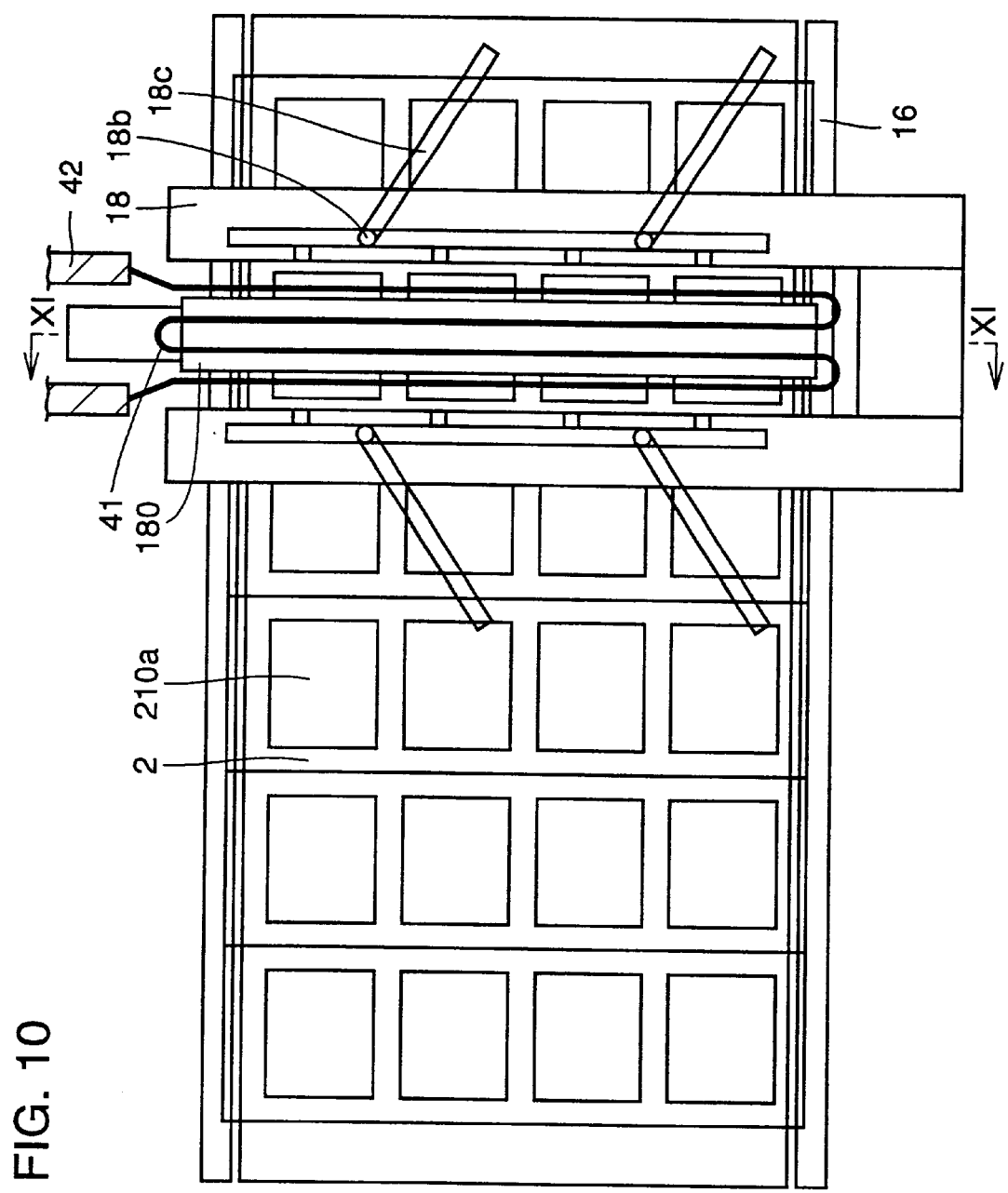
FIG. 10 is a plan view of a flip chip heating device.
Figure 11:
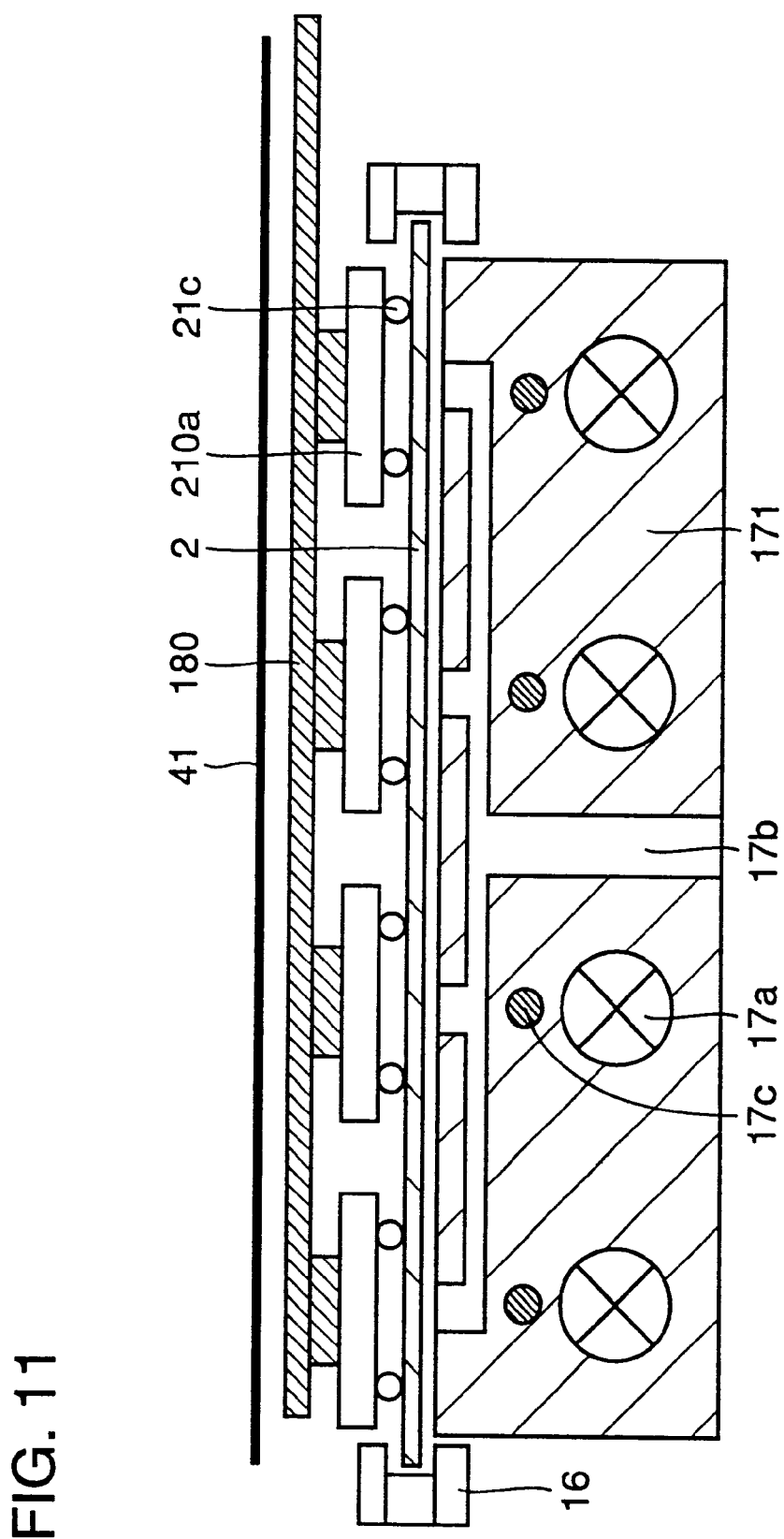
FIG. 11 is a cross sectional view along the line XI—XI in FIG. 10.
Figure 12:
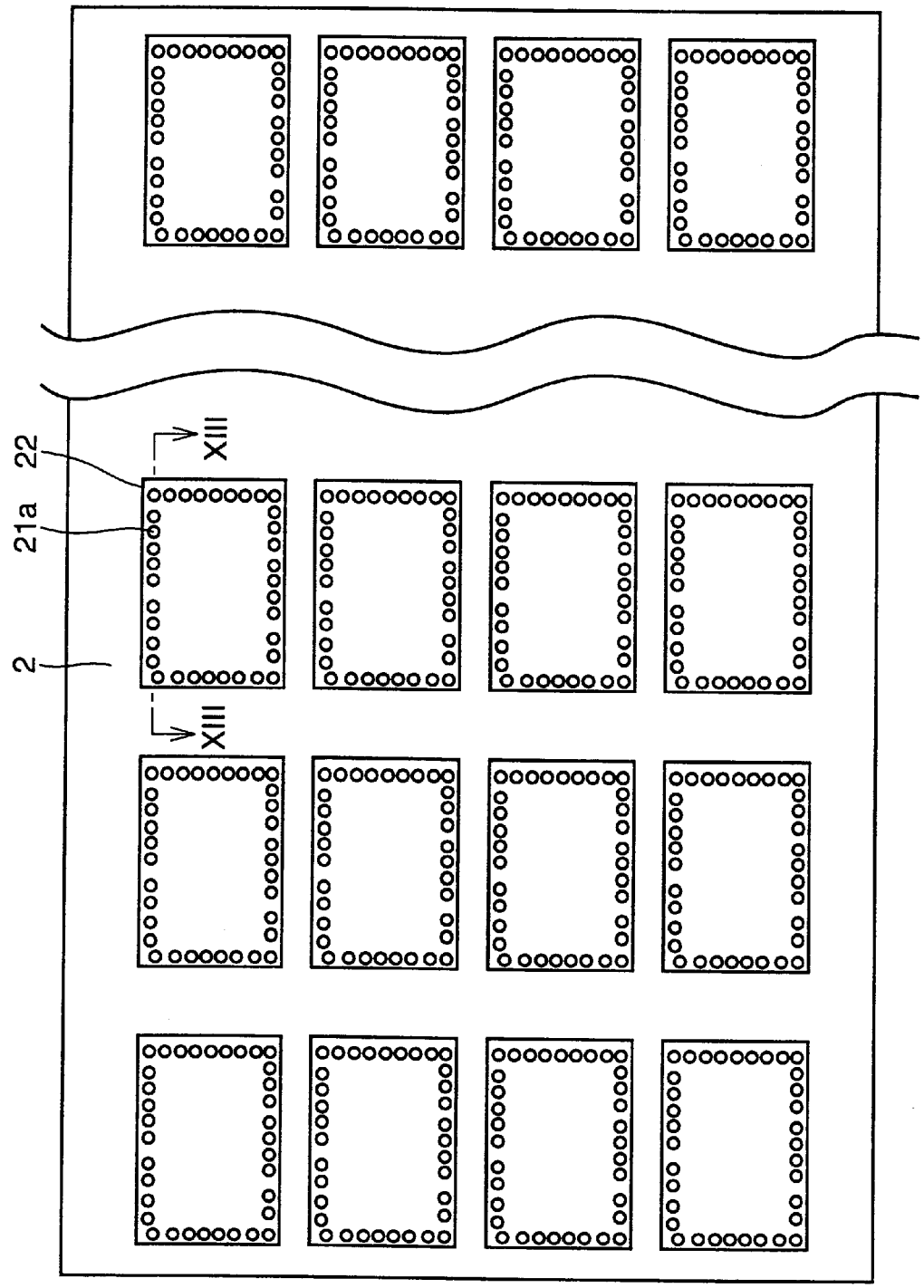
FIG. 12 is a plan view of a substrate where solder bumps are formed.
Figure 13:
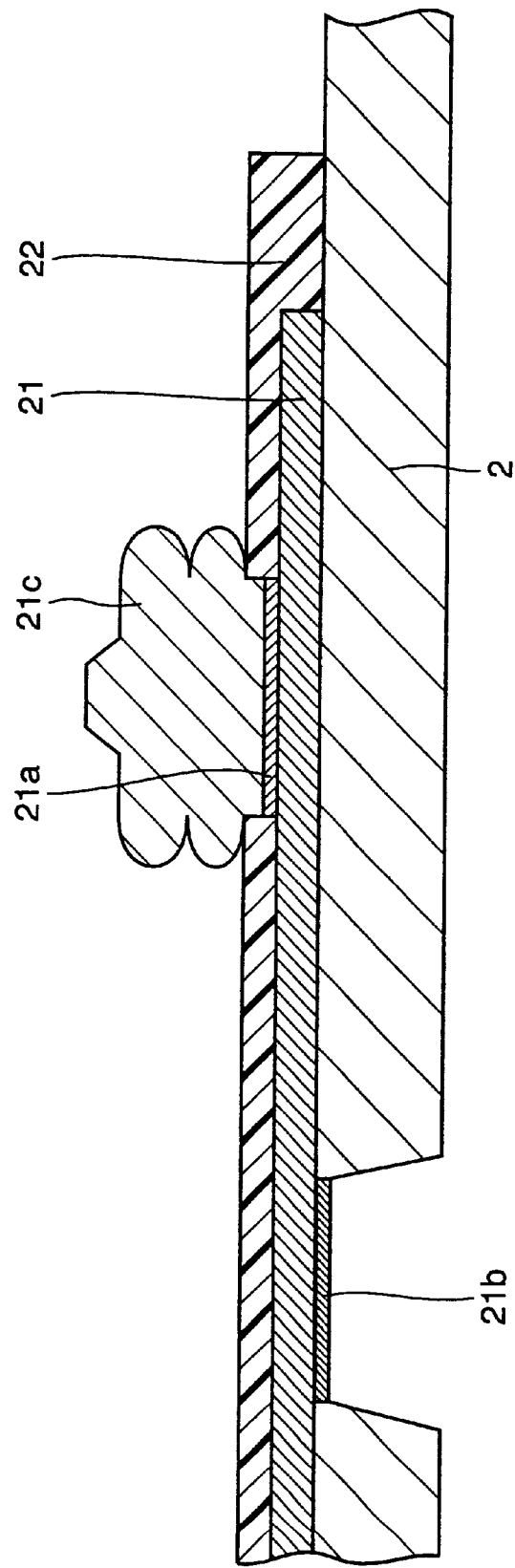
FIG. 13 is a partial cross sectional view along the line XIII—XIII in FIG. 12.
Figure 14:
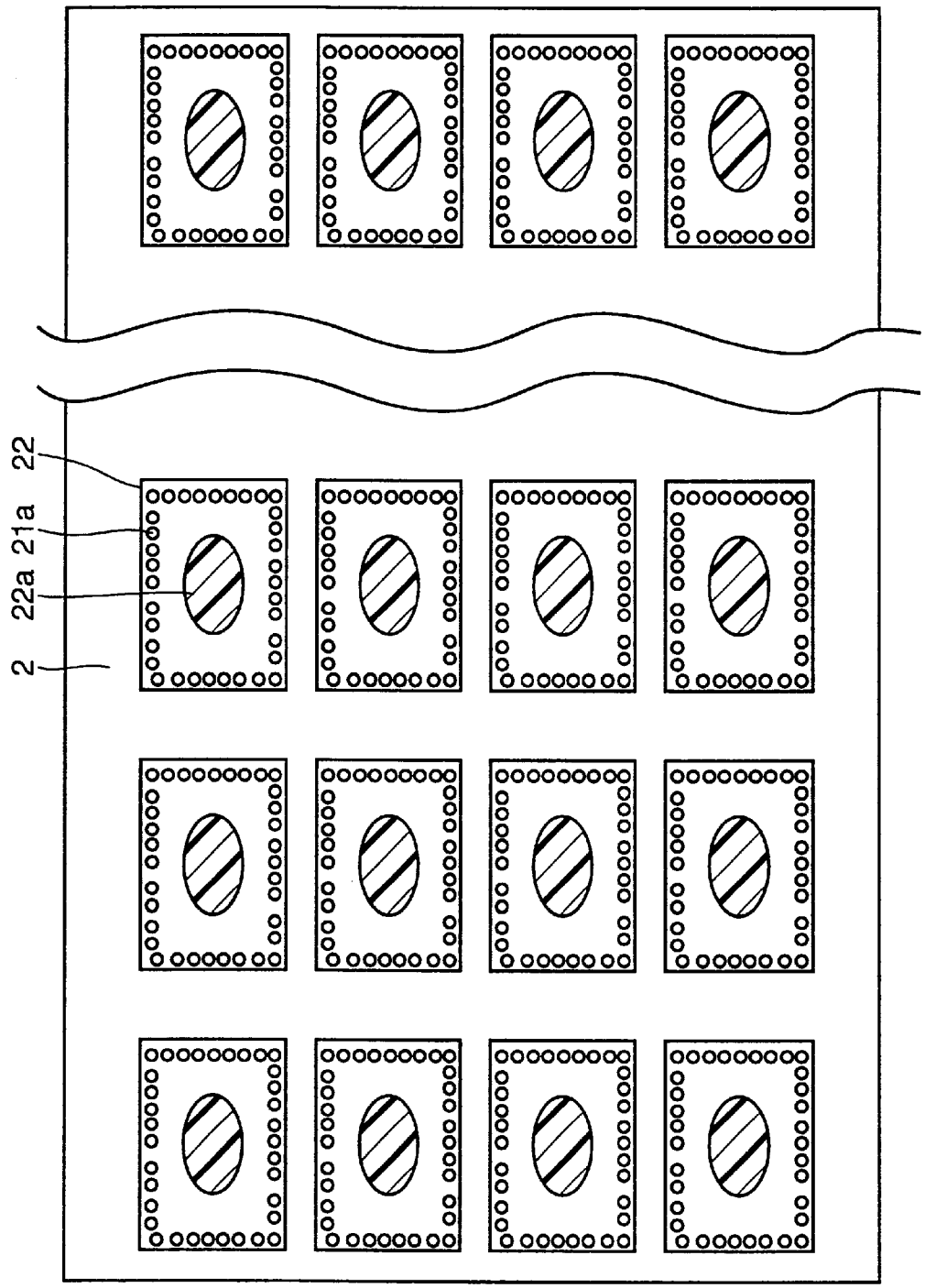
FIG. 14 is a plan view illustrating a conventional art of applying flux in order to produce solder balls on a substrate.
Figure 15:
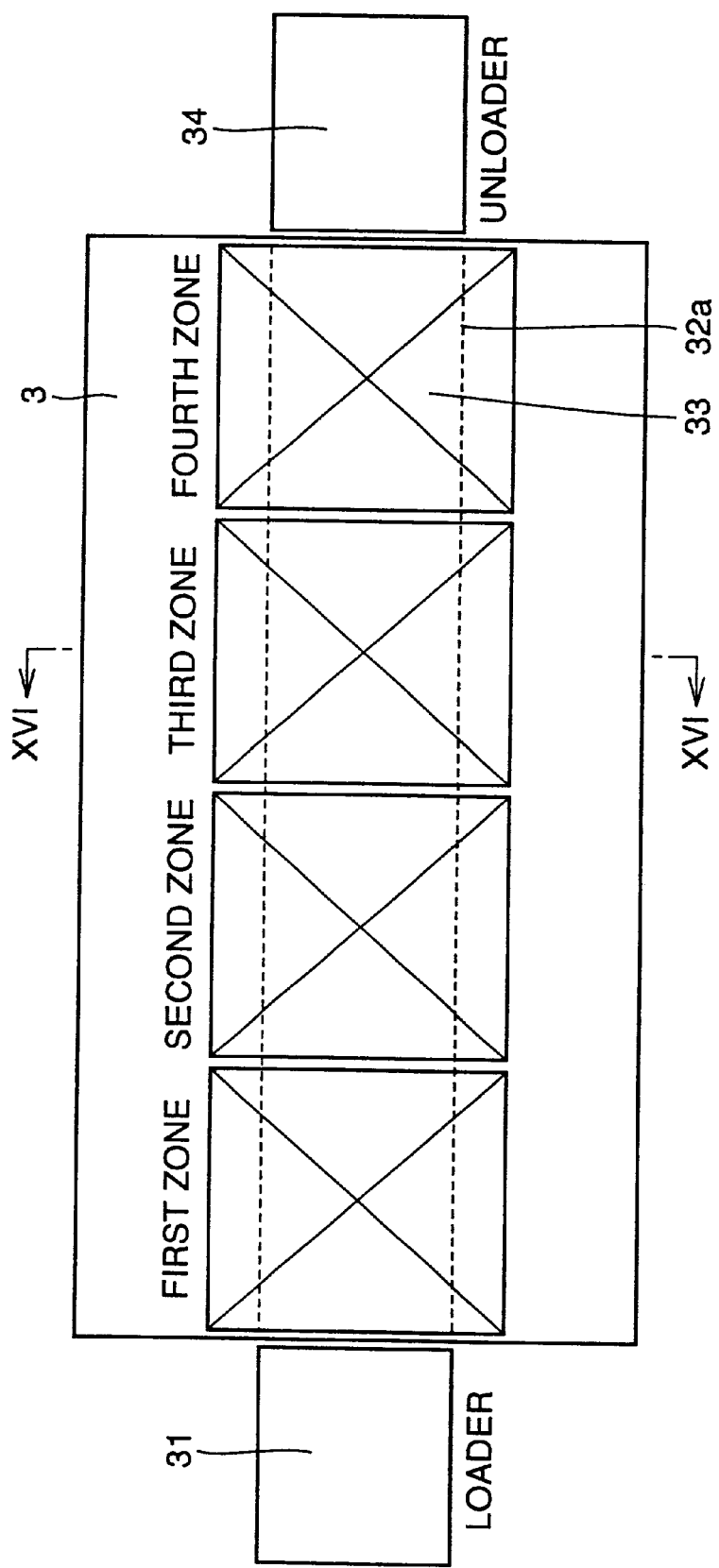
FIG. 15 is a plan view of a reflow furnace for melting solder.
Figure 16:
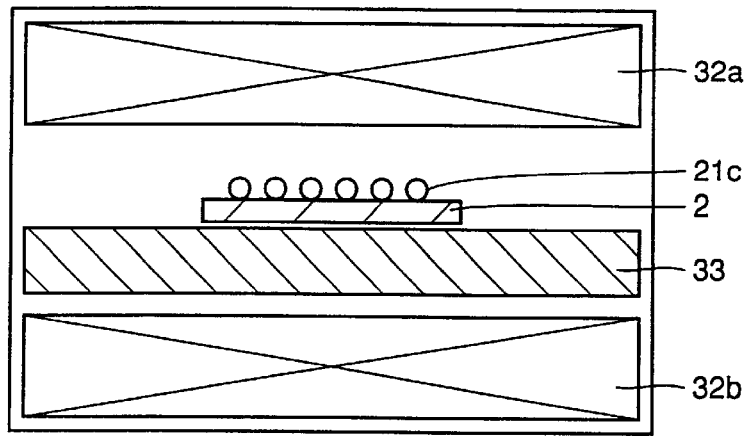
FIG. 16 is a cross sectional view along the line XVI—XVI in FIG. 15.
Figure 17:
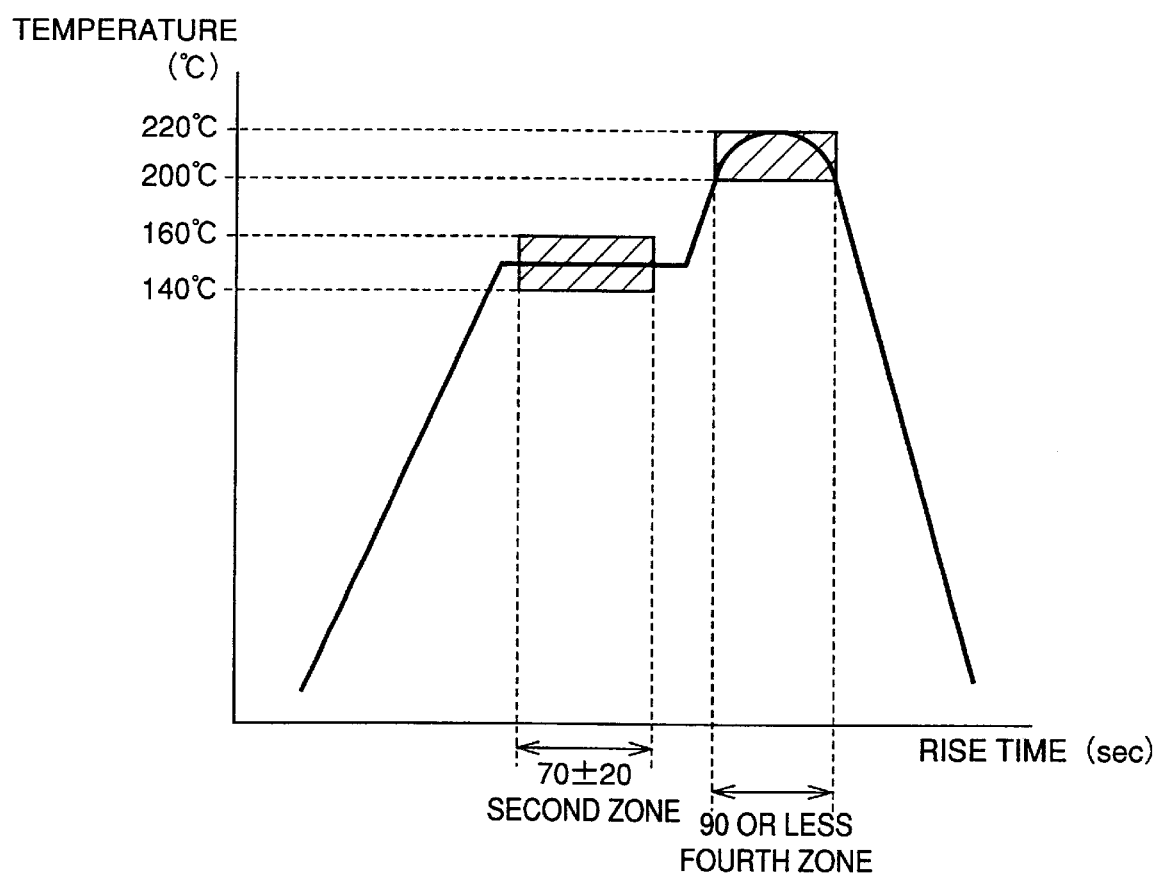
FIG. 17 illustrates a temperature profile in the reflow furnace.

FIG. 10 is a plan view of a flip chip heating device, and FIG. 11 is a cross sectional view along the line XI—XI in FIG. 10.

A flip chip process refers to a process of aligning an electrode portion of a semiconductor device 210a having the surface of the electrode portion processed by UBM (Under Bump Metal) with an inner electrode 21a (see FIG. 1) of a substrate, and bonding them together. When solder is used as the bonding material, they can be bonded together by pressurizing them while heating the substrate or the semiconductor device. However, when refractory metal is used as the bonding material, the problem described in relation with the second embodiment arises. In the fourth embodiment, the semiconductor device and the substrate are preliminarily bonded just by pressurizing them, and then they are transferred to a heating stage using a substrate transport rail 16. A process similar to that of the first embodiment is here applied. Specifically, a substrate 2 is fixed by a frame holder 18 and a suction hole 17b and N2-H2 mixed gas is supplied from a nonoxidizing gas supply hole. A chip suction head 180 sucks the back surface of a semiconductor device 210a, and high-frequency current is applied to an induction heating coil 41 thereon to melt a bump 21c. At the same time, chip suction head 180 is caused to fall. Accordingly, the semiconductor device is pressurized and positioned. Since resin for sealing in the following process fills the portion between the semiconductor device and the substrate, the height of the semiconductor device should be controlled.

At the same time, a Peltier device for cooling 17a and a thermocouple 17c provided to a cooling block 171 and a non-contact thermometer 9b (see FIG. 5) are used to set the temperature of the substrate at the glass transition point or less to control the current applied to induction heating coil 41. In this embodiment, the electrode bonding material of refractory metal placed between the semiconductor device and the substrate can be melted without oxidization and without damage to substrate 2 due to the heat, and bonding is thus implemented with a high reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of melting a pump formed on a substrate by using an induction heating coil in an ambient of low oxygen concentration to heat and melt the bump by electromagnetic induction, wherein magnetic filed of said induction heating coil is applied perpendicularly to a surface of said substrate, said induction heating coil is moved horizontally relative to the surface of said substrate, and said substrate is heated by a heater in order to reduce the current applied to said induction heating coil.

2. The method of melting a bump according to claim 1, wherein temperature of said substrate is measured to control an amount of current applied to said induction heating coil according to the temperature.

3. The method of melting a bump according to claim 1, wherein the bump is melted while said substrate is cooled by a Peltier device.

4. An apparatus for melting a bump formed on a substrate, comprising:

ambient supply means for supplying an ambient of low oxygen concentration onto said substrate; and an induction heating coil for heating said bump by electromagnetic induction, wherein said induction heating coil includes a cylindrical section through which cooling water flows, and a high-frequency current applying section obliquely extending downward from said cylindrical section through which high-frequency current flows and a cross sectional shape of a tip portion of said high-frequency current applying section in a plane perpendicular to a direction in which said induction heating coil extends is substantially a right-angled isosceles triangle.

5. The apparatus for melting a bump according to claim 4, wherein said induction heating coil is U-shaped in a plan view.

6. The apparatus for melting a bump according to claim 4, wherein said cylindrical section and said high-frequency current applying section are integrally formed of copper.

7. The apparatus for melting a bump according to claim 4, wherein said induction heating coil is disposed to set one of two sides except for the hypotenuse of said right-angled isosceles triangle in parallel with said substrate.

8. The apparatus for melting a bump according to claim 4, wherein said cross sectional shape of said induction heating coil is substantially symmetrical relative to a straight line extending from a center of said cylindrical section to an apex of said right-angled isosceles triangle.

9. The apparatus for melting a bump according to claim 4, further comprising:

temperature measuring means for measuring temperature of said substrate; and applied current control means for controlling an amount of current applied to said induction heating coil according to information supplied from said temperature measuring means.

10. The apparatus for melting a bump according to claim 4, further comprising:

disposing means for disposing said induction heating coil to cause magnetic field of said induction heating coil to be applied perpendicularly to a surface of said substrate;

moving means for horizontally moving said induction heating coil relative to a surface of said substrate; and heating means for heating said substrate.

11. The apparatus for melting a bump according to claim 4, further comprising a Peltier device for cooling said substrate.

* * * * *